(12) United States Patent
Tseng et al.

(10) Patent No.: US 11,134,574 B2
(45) Date of Patent: Sep. 28, 2021

(54) DOUBLE-SIDED CIRCUIT BOARD AND METHOD FOR PREPARING THE SAME

(71) Applicant: TAIWAN GREEN POINT ENTERPRISES CO., LTD., Taichung (TW)

(72) Inventors: I-Lin Tseng, Taichung (TW); Tzu-Chun Chen, Taichung (TW)

(73) Assignee: Taiwan Green Point Enterprises Co., Ltd., Taichung (TW)

( * ) Notice: Subject to any disclaimer, the term of this patent is extended or adjusted under 35 U.S.C. 154(b) by 227 days.

(21) Appl. No.: 16/154,822

(22) Filed: Oct. 9, 2018

(65) Prior Publication Data

US 2019/0045638 A1 Feb. 7, 2019

Related U.S. Application Data

(62) Division of application No. 14/388,400, filed as application No. PCT/US2013/034309 on Mar. 28, 2013, now Pat. No. 10,098,242.

(Continued)

(51) Int. Cl.
*H05K 3/46* (2006.01)
*H05K 3/00* (2006.01)
*H05K 3/18* (2006.01)
*H05K 3/38* (2006.01)
*H05K 3/42* (2006.01)
*H05K 1/02* (2006.01)

(Continued)

(52) U.S. Cl.
CPC ......... *H05K 3/4602* (2013.01); *H05K 1/0298* (2013.01); *H05K 1/115* (2013.01); *H05K 3/0026* (2013.01); *H05K 3/107* (2013.01); *H05K 3/182* (2013.01); *H05K 3/381* (2013.01); *H05K 3/42* (2013.01); *H05K 3/426* (2013.01); *B23K 26/384* (2015.10); *H05K 3/027* (2013.01); *H05K 2203/107* (2013.01); *Y10T 29/49165* (2015.01)

(58) Field of Classification Search
CPC .... H05K 3/4602; H05K 3/0026; H05K 3/107; H05K 3/182; H05K 3/381; H05K 3/42; H05K 3/426; H05K 3/027; H05K 1/0298; H05K 1/115; Y10T 29/49165
USPC ........................ 29/846, 829, 825, 592.1, 832
See application file for complete search history.

(56) References Cited

U.S. PATENT DOCUMENTS 4,581,301 A * 4/1986 Michaelson ........... H05K 3/188
205/125
5,252,195 A * 10/1993 Kobayashi ............. H05K 3/428
205/126

(Continued)

*Primary Examiner* — Peter Dungba Vo
*Assistant Examiner* — Azm A Parvez
(74) *Attorney, Agent, or Firm* — Young Basile Hanlon & MacFarlane, P.C.

(57) ABSTRACT

A method for preparing a conductive circuit can begin with the preparation of a non-conductive substrate having a top surface and a bottom surface, and then utilizing a pulse laser to create a top circuit pattern upon the top surface, a bottom circuit pattern upon the bottom surface, and a through hole connecting the top circuit pattern with the bottom circuit pattern. Subsequently, a conductive circuit is formed upon the top circuit pattern and the bottom circuit pattern and inside the through hole, wherein the conductive circuit is restricted from being formed upon the top surface outside of the top isolation region and the bottom surface outside of the bottom isolation region.

4 Claims, 12 Drawing Sheets

Related U.S. Application Data

(60) Provisional application No. 61/617,397, filed on Mar. 29, 2012.

(51) Int. Cl.
| | | |
|---|---|---|
| *H05K 1/11* | (2006.01) | |
| *H05K 3/10* | (2006.01) | |
| *B23K 26/384* | (2014.01) | |
| *H05K 3/02* | (2006.01) | |

(56) References Cited

U.S. PATENT DOCUMENTS

| | | | | |
|---|---|---|---|---|
| 5,494,781 A | * | 2/1996 | Ohtani | B23K 26/067 |
| | | | | 430/311 |
| 6,591,495 B2 | * | 7/2003 | Hirose | B23K 26/389 |
| | | | | 29/846 |
| 2012/0184099 A1 | * | 7/2012 | Souter | B23K 26/142 |
| | | | | 438/669 |
| 2013/0084405 A1 | * | 4/2013 | Lee | H05K 3/184 |
| | | | | 427/555 |

* cited by examiner

DOUBLE-SIDED CIRCUIT BOARD AND METHOD FOR PREPARING THE SAME

CROSS REFERENCE TO RELATED APPLICATIONS

This application is a division of U.S. patent application Ser. No. 14/388,400, filed Sep. 26, 2014, which is a 371 National Stage Application of PCT/US2013/034309 filed Mar. 28, 2013 which claims the benefit of provisional Application Ser. No. 61/617,397 entitled "Method for realizing a double-sided circuit connected through an invisible micro hole on a non-conductive substrate," filed Mar. 29, 2012, all of which are incorporated by reference in their entireties.

FIELD OF INVENTION

The present invention relates to the field of a circuit board and method for preparing the same, and more particularly, to a circuit board with a double-sided conductive circuit connected by a micro conductive via and method for preparing the same using a pulse laser.

BACKGROUND

Conventional hole-processing methods used in fabricating circuit boards include mechanical drilling and injection molding. The mechanical drilling method cannot make small sized holes due to drilling tool limitations. Consequently, the holes will be easily seen and the circuit board cannot be waterproof. In addition, it is difficult to control the quality of the holes due to the vibration of the power drill during mechanical drilling operations.

Similarly, injection molding uses a mold with pins to define holes in the insulation substrate of a circuit board. To prevent the pins from collapsing because of the injection of insulation resin, the pins cannot be of a small size, and the injection molding technique cannot make holes of a small size as well. Consequently, the holes will be easily seen and the circuit board cannot be waterproof. In addition, the positions of the holes need to be confirmed and the mold needs to be manufactured first, and then the injection molding can be performed to manufacture the insulation substrate. As a result, the position and size of the holes cannot be easily changed.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY

One aspect of the present invention discloses a method for preparing a circuit board, comprising steps of preparing a non-conductive substrate having a top surface and a bottom surface; utilizing a pulse laser to create a top circuit pattern upon the top surface, a bottom circuit pattern upon the bottom surface, and a through hole connecting the top circuit pattern with the bottom circuit pattern; and forming a conductive circuit upon the top circuit pattern and the bottom circuit pattern and inside the through hole, wherein the conductive circuit is restricted from being formed upon the top surface outside of the top isolation region and the bottom surface outside of the bottom isolation region.

Another aspect of the present invention discloses a method for preparing a circuit board, comprising steps of utilizing a pulse laser to create a through hole penetrating a non-conductive substrate; forming a metallic base layer upon at least one surface and inside the through hole of the non-conductive substrate; forming a first metal layer at least upon the metallic base layer; and removing the metallic base layer from at least a portion of the non-conductive substrate to create an isolation region surrounding a circuit pattern, wherein the metallic base layer comprising the circuit pattern is physically separated from a remainder of the metallic base layer existing upon the at least one surface of the non-conductive substrate.

Another aspect of the present invention discloses a method for preparing a circuit board, comprising steps of preparing a non-conductive substrate having a top surface and a bottom surface; utilizing a pulse laser to create a top circuit pattern upon the top surface, a bottom circuit pattern upon the bottom surface, and a through hole connecting the top circuit pattern with the bottom circuit pattern; submerging the non-conductive substrate in an active metal solution for a predefined amount of time, wherein the active metal solution contains metallic particles; removing the non-conductive substrate from the active metal solution when the predetermined amount of time has elapsed, wherein the removed non-conductive substrate comprises a metallic base layer formed from the metallic particles; utilizing the pulse laser to remove a portion of the metallic base layer from the non-conductive substrate to form at least one isolation region, wherein the metallic base layer comprises at least two distinct continuous regions separated from each other so that the two distinct continuous regions are electrically isolated from each other; and placing the non-conductive substrate with the at least one isolation region in a chemical plating solution to form a first metal layer upon the metallic base layer.

Another aspect of the present invention discloses a circuit board comprising a non-conductive substrate having a conductive via with a substantially non-tapered profile, which forms a first portion of a conductive circuit; a metallic base layer upon a portion of the non-conductive substrate, which forms a second portion of the conductive circuit, wherein a portion of the non-conductive substrate lacking the metallic base layer comprises a laser pattern; and a first metal layer upon the metallic base layer, wherein the portion of the non-conductive substrate lacking the metallic base layer also lacks the first metal layer.

The conventional hole-processing methods used in fabricating circuit boards are mechanical drilling and injection molding, which cannot make holes of a smaller diameter; therefore, the holes will be easily seen, and the circuit board cannot be waterproof. In contrast, the embodiment of the present invention provides a hole-processing method that utilizes a pulse laser to create holes of a smaller size in the non-conductive substrate and the holes are substantially invisible and waterproof after forming a decoration layer covering the top surface and the holes.

In addition, before performing the conventional injection molding technique to manufacture the holes in the insulation substrate, the positions and sizes of the holes must be confirmed and the mold needs to be manufactured. As a result, the positions and sizes of the holes cannot be easily changed after the mold is manufactured. However, in the embodiment of the present invention, utilizing the pulse laser to create holes of a desired size in the non-conductive substrate can be performed on any desired position of the non-conductive substrate, i.e., the positions and sizes of the holes can be easily changed according to the embodiment of the present invention.

The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION OF THE PREFERRED EMBODIMENTS

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a circuit board with a double-sided conductive circuit connected by a micro via and method for preparing the same using a pulse laser. In order to make the present disclosure completely comprehensible, detailed steps and structures are provided in the following description. Obviously, implementation of the present disclosure does not limit special details known by persons skilled in the art. In addition, known structures and steps are not described in detail, so as not to limit the present disclosure unnecessarily. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
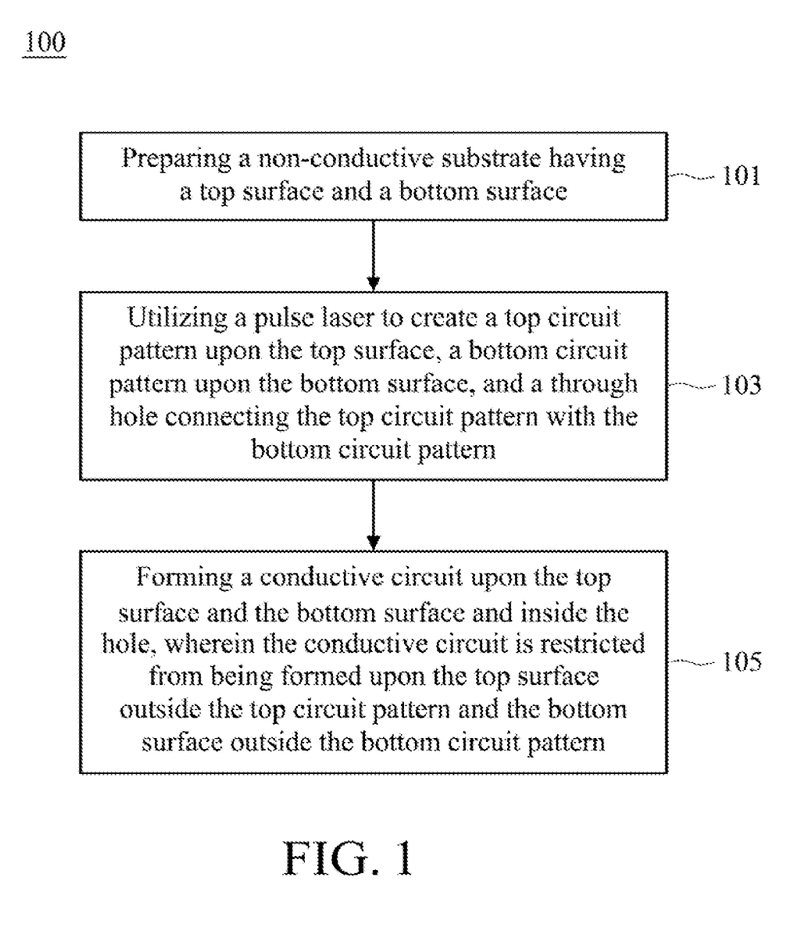
FIG. 1 is a flow chart of a method providing a high-level overview of a fabricating process for a circuit board with a double-sided conductive circuit connected by a micro via in a non-conductive substrate according to one embodiment of the present invention.

FIG. 1 is a flow chart of a method 100 providing a high-level overview of a fabricating process for a circuit board with a double-sided conductive circuit connected by a micro via in a non-conductive substrate according to one embodiment of the present invention. The method 100 can begin in step 101, where a non-conductive substrate having a top surface and a bottom surface is prepared. As used herein, the term "non-conductive substrate" can be used to refer to a variety of materials that do not conduct any or conduct only a negligible amount of electricity. Examples of non-conductive substrates that can be used in the process described herein can include, but are not limited to, high-molecular polymers such as polycarbonate or acrylonitrile-butadiene-styrene, glass fiber, ceramics, wood, fabric, and the like.

In step 103 where a pulse laser is used to create a top circuit pattern upon the top surface, a bottom circuit pattern upon the bottom surface, and a through hole connecting the top circuit pattern with the bottom circuit pattern. The pulse laser used to create the through hole can include, but is not limited to, infra-red or green pulse lasers with a power of 6.0-13.0 W and a pulse frequency of 5.0-30.0 kHz. In one embodiment of the present invention, the through hole has a non-tapered profile and substantially has a profile width of 0.2-0.05 mm. Creating the top circuit pattern and the bottom circuit pattern increases the roughness of the non-conductive substrate such that the subsequent fabrication process can form metallic layers on the surfaces of the non-conductive substrate with an increased bonding force.

In step 105, fabrication processes are performed to form a conductive circuit upon the top surface and the bottom surface and inside the hole of the non-conductive substrate. In one embodiment of the present invention, the conductive circuit includes a metallic base layer, a first metal layer and a second metal layer. The metallic base layer is coated upon the top surface and the bottom surface and inside the through hole, and then a first metal layer is formed at least upon the metallic base layer.

In one embodiment of the present invention, the metallic base layer is formed by submerging the non-conductive substrate in an active metal solution for a predefined amount of time, wherein the active metal solution contains metallic particles, and the metallic particles used to create the metallic base layer can include, but are not limited to, palladium, rhodium, platinum, iridium, osmium, gold, nickel, iron, and combinations thereof. In one embodiment of the present invention, the first metal layer is formed by an electroless plating process performed in a chemical plating solution, which can be a copper solution.

The pulse laser is used again to remove the metallic base layer and the first metal layer from at least a portion of the non-conductive substrate so as to create a top isolation region surrounding the top circuit pattern and a bottom isolation region surrounding the bottom circuit pattern, wherein the metallic base layer and the first metal layer upon the circuit patterns are physically separated from a remainder of the metallic base layer and the first metal layer upon the surfaces of the non-conductive substrate, and the through hole is inside the isolation regions. Subsequently, a second metal layer can be selectively formed using an electroplating process upon the first metal layer inside the top isolation region, the bottom isolation region, and the through hole of the non-conductive substrate.

Upon completion of step 105, the non-conductive substrate and/or conductive circuit can be further utilized in an electronics fabrication process (i.e., electronic components can be connected to the created continuous conductive circuit and/or the non-conductive substrate can be installed within a device).

FIGS. 2-17 illustrate a process flow depicting the method for preparing a circuit board with a double-sided conductive circuit on a non-conductive substrate according to one embodiment of the present invention.

Figure 2:
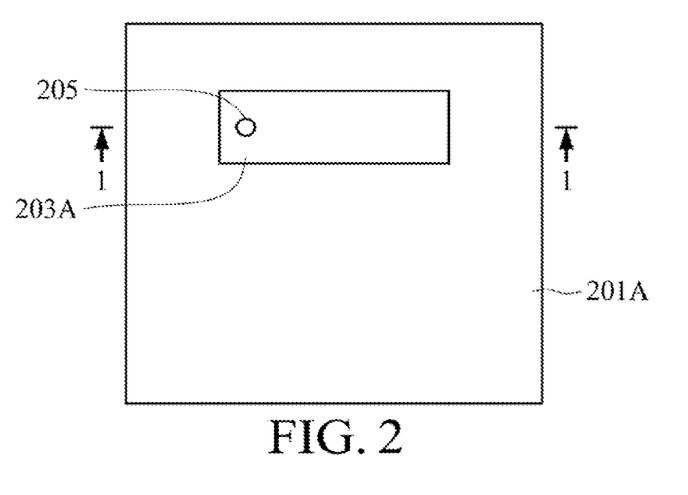
FIG. 2 is a top view of a non-conductive substrate with a circuit pattern and a through hole formed by a pulse laser according to one embodiment of the present invention.
Figure 3:
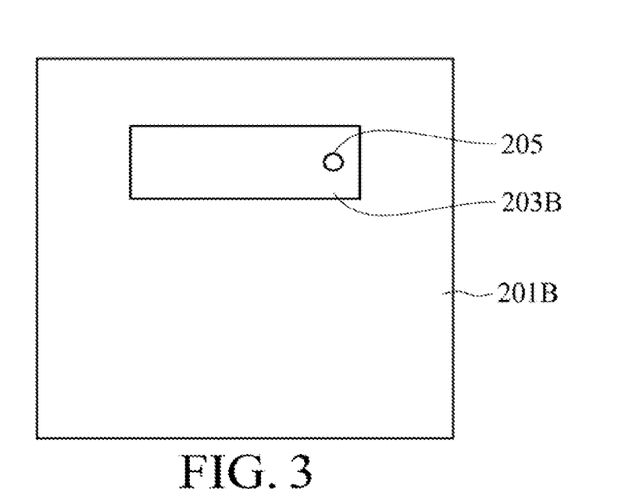
FIG. 3 is a bottom view of the non-conductive substrate with the circuit pattern and the through hole in FIG. 2 according to one embodiment of the present invention.
Figure 4:
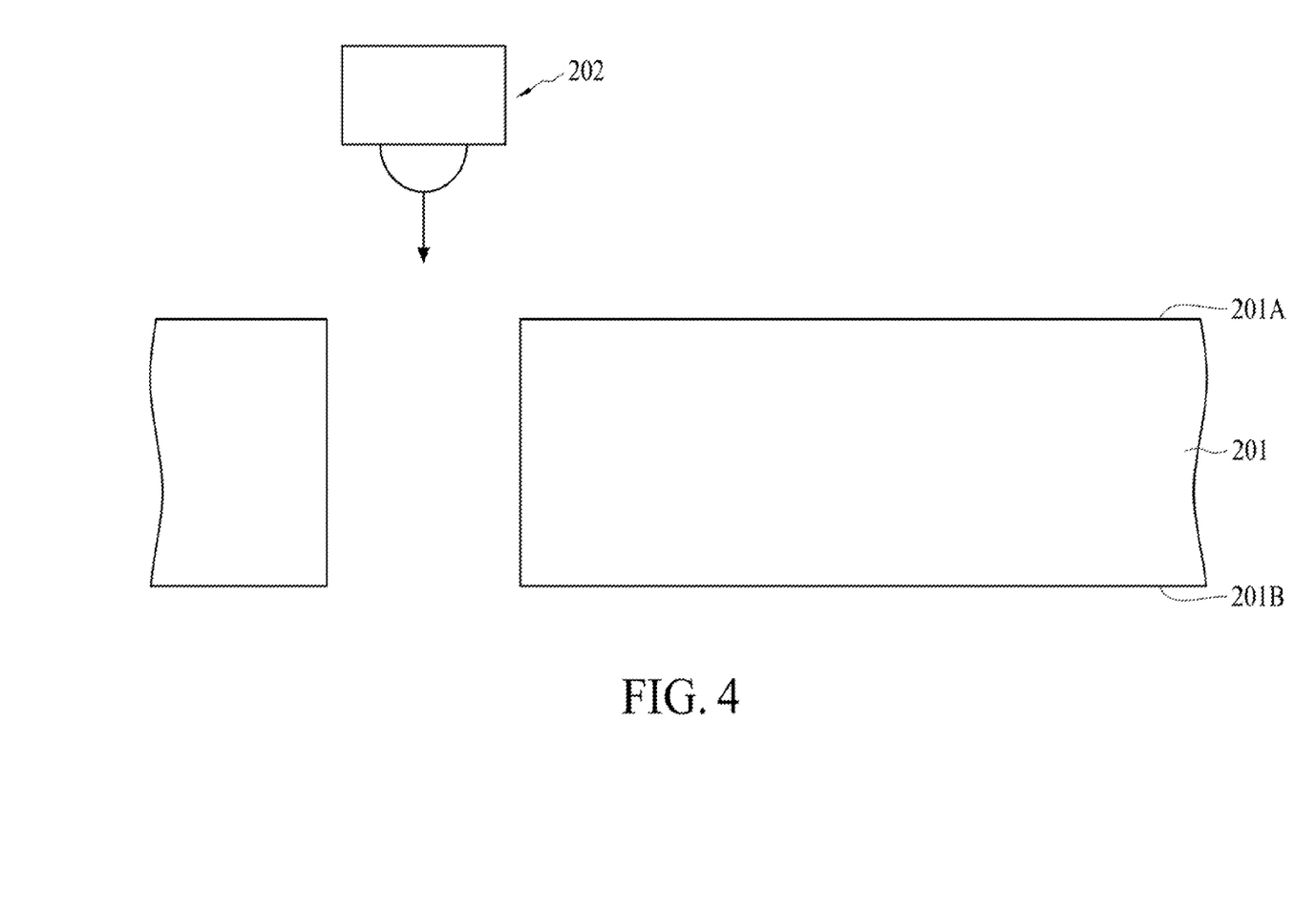
FIG. 4 is a close-up cross-sectional view along a sectional line 1-1 in FIG. 2 according to one embodiment of the present invention.

Referring to FIGS. 2-4, the process flow can begin with a non-conductive substrate 201 having a top surface 201A and a bottom surface 201B. It should be emphasized that the surface or surfaces of the non-conductive substrate 201 need not be limited to a planar silhouette. That is, the described process can create a conductive circuit upon a non-conductive substrate 201 where the receiving surface includes concavity and/or convexity. As used herein, the term "non-conductive substrate" can be used to refer to a variety of materials that do not conduct any or conduct only a negligible amount of electricity. Examples of non-conductive substrates that can be used in the process described herein can include, but are not limited to, high-molecular polymers such as polycarbonate or acrylonitrile-butadiene-styrene, glass fiber, ceramics, wood, fabric, and the like.

Subsequently, a pulse laser 202 is used to create a top circuit pattern 203A upon the top surface 201A, a bottom circuit pattern 203B upon the bottom surface 201B, and a through hole 205 connecting the top circuit pattern 203A with the bottom circuit pattern 203B. It should be noted that the shape of the top circuit pattern 203A and the bottom circuit pattern 203B need not be limited to a rectangular silhouette. That is, the pulse laser 202 can create a circuit pattern upon the non-conductive substrate 201 where the circuit pattern includes corners and/or arcs. In addition, the shape of the top circuit pattern 203A can be the same or different from that of the bottom circuit pattern 203B.

The pulse laser 202 can include, but is not limited to, infra-red or green pulse lasers with a power of 6.0-13.0 W and a pulse frequency of 5.0-30.0 kHz. In one embodiment of the present invention, the through hole 205 has a non-tapered profile and substantially has a profile width of 0.2-0.05 mm. Creating the top circuit pattern 203A and the bottom circuit pattern 203B increases the roughness of the non-conductive substrate 201 such that the subsequent fabrication process can form metallic layers on the surfaces of the non-conductive substrate 201 with an increased bonding force.

Figure 5:
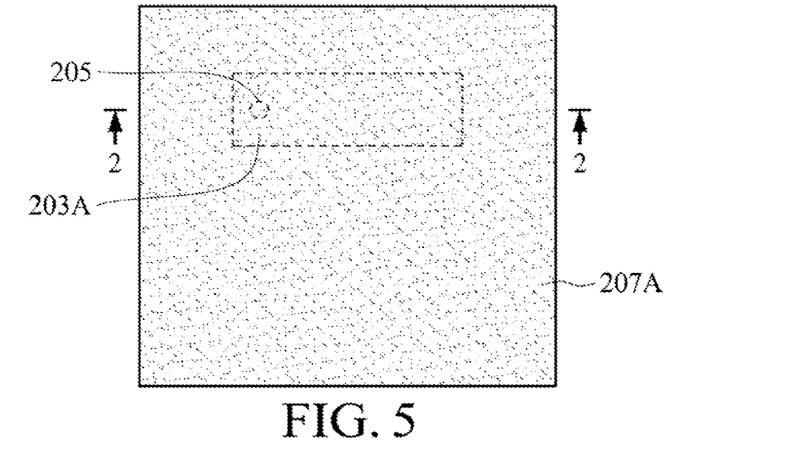
FIG. 5 is a top view of the non-conductive substrate with a metallic base layer according to one embodiment of the present invention.
Figure 6:
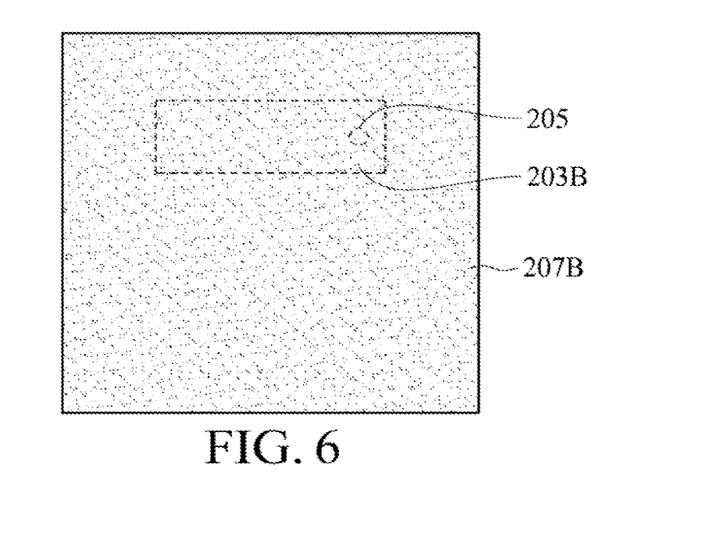
FIG. 6 is a bottom view of the non-conductive substrate with the metallic base layer in FIG. 5 according to one embodiment of the present invention.
Figure 7:
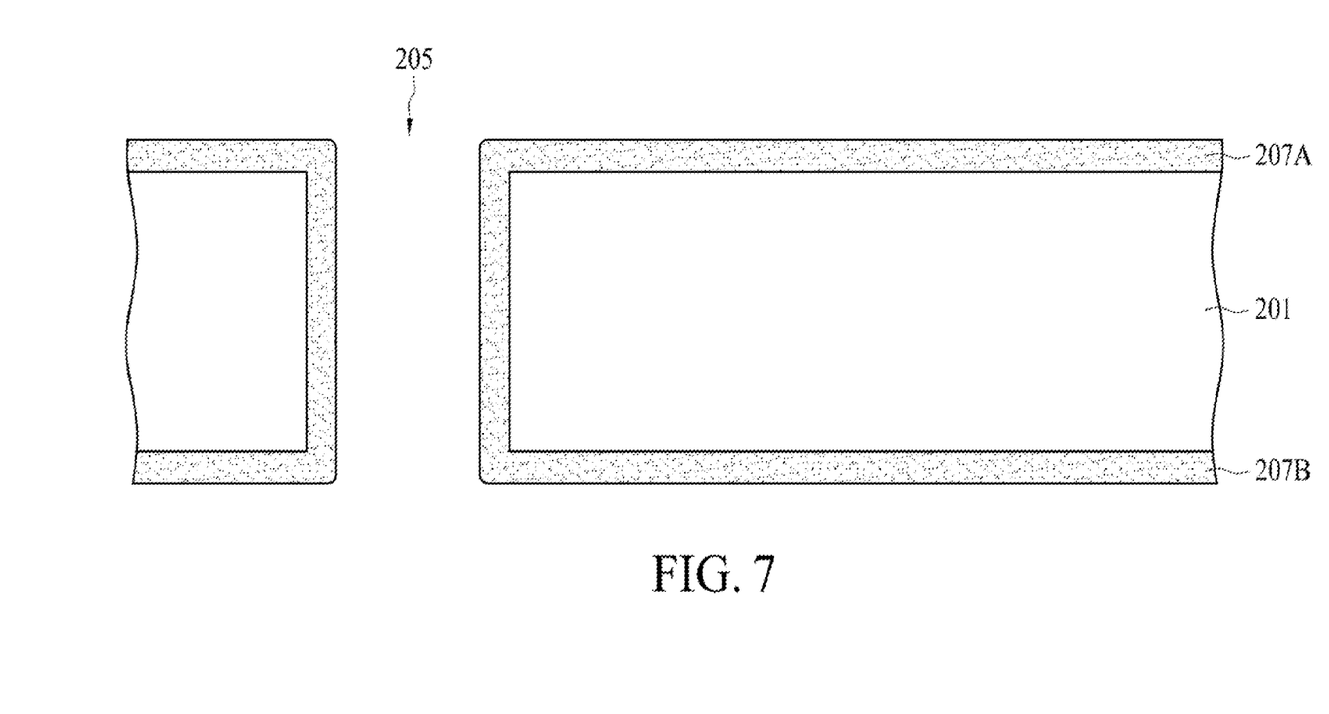
FIG. 7 is a close-up cross-sectional view along a sectional line 2-2 in FIG. 5 according to one embodiment of the present invention.

Referring to FIGS. 5-7, the non-conductive substrate 201 can be placed in an active metal solution, such as a palladium solution having a molarity of 10-70 ppm, to form a top metallic base layer 207A upon the top surface 201A and a bottom metallic base layer 207B upon the bottom surface and inside the through hole 205 of the non-conductive substrate 201. The specific thickness of the metallic base layers 207A and 207B can vary based upon the type of active metal and the type of non-conductive substrate 201, as well as other process-specific variables.

It should be noted that the metallic base layers can be formed on the entirety of the surface area presented by the non-conductive substrate 201, and that the layering shown in the process flow can represent a cut-away view so as to emphasize the layer distinctions. That is, if all surfaces of the plate-shaped non-conductive substrate 201 are exposed when placed in the active metal solution, then the resultant structure would have the metallic base layer covering the entirety of the non-conductive substrate 201.

Figure 8:
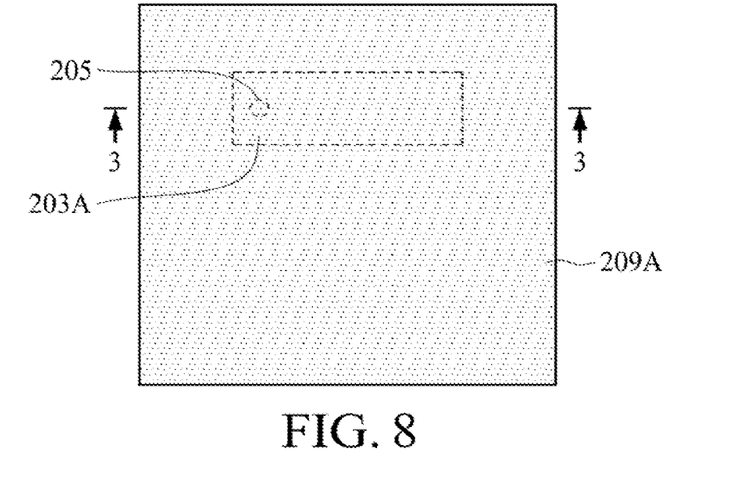
FIG. 8 is a top view of the non-conductive substrate with a first metal layer according to one embodiment of the present invention.
Figure 9:
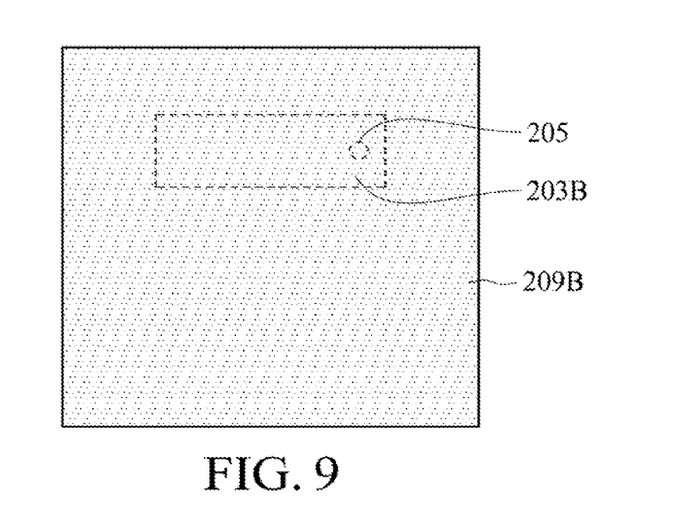
FIG. 9 is a bottom view of the non-conductive substrate with the first metal layer in FIG. 8 according to one embodiment of the present invention.
Figure 10:
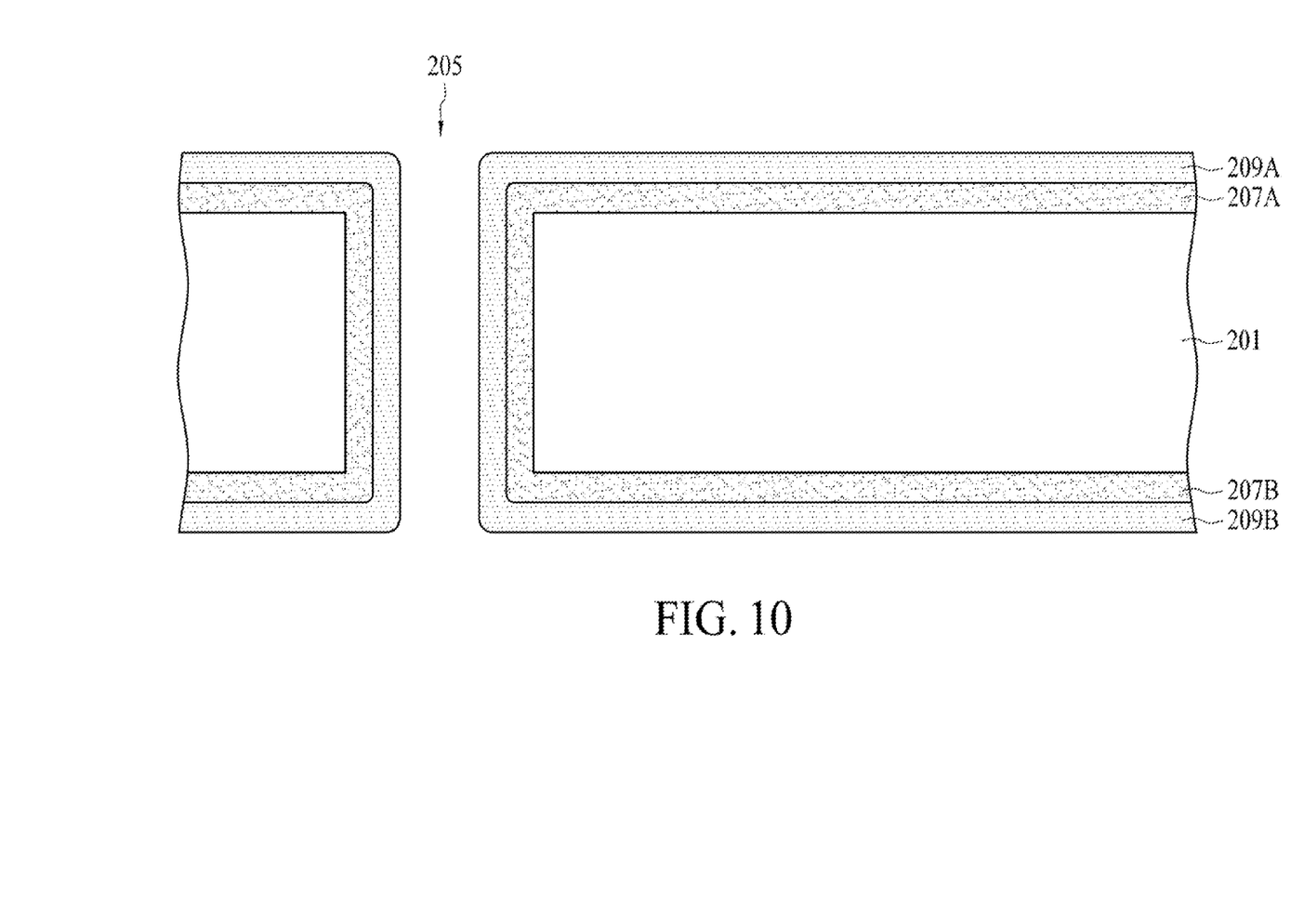
FIG. 10 is a close-up cross-sectional view along a sectional line 3-3 in FIG. 8 according to one embodiment of the present invention.

Referring to FIGS. 8-10, an electroless plating process, such as a chemical plating process, can be performed using a chemical plating solution to form a first top metal layer 209A upon the top metallic base layer 207A and a first bottom metal layer 209B upon the bottom metallic base layer 207B and inside the through hole 205 of the non-conductive substrate 201. For example, an electroless copper plating process can result in a copper layer, or an electroless nickel plating process can produce a nickel layer.

Figure 11:
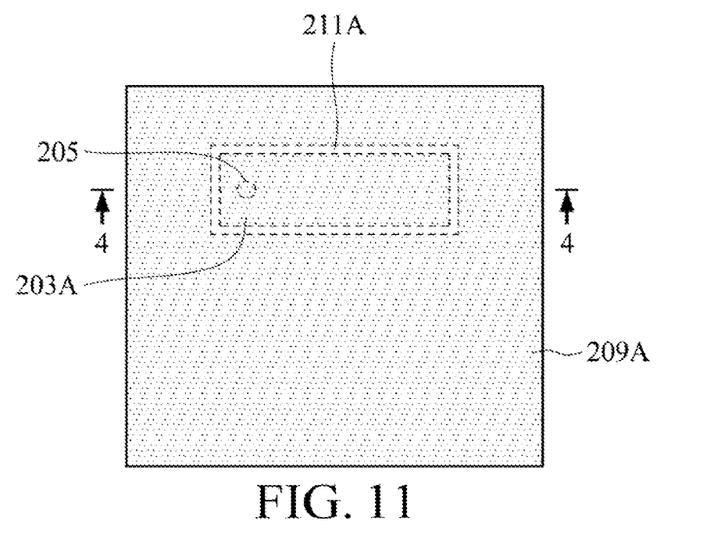
FIG. 11 is a top view of the non-conductive substrate with an isolation region formed by the pulse laser according to one embodiment of the present invention.
Figure 12:
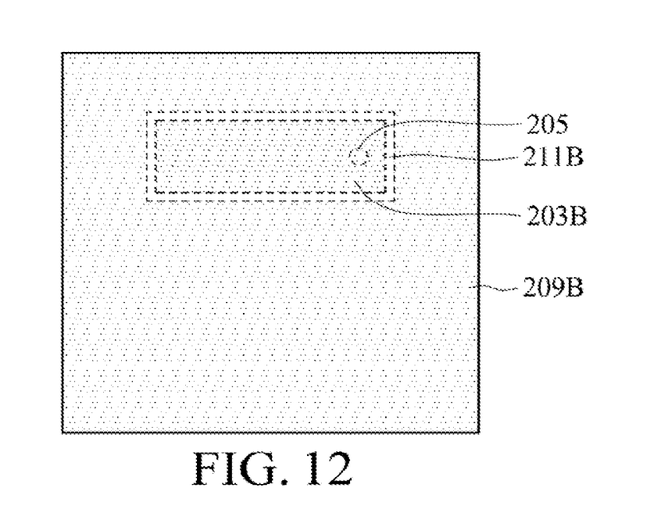
FIG. 12 is a bottom view of the non-conductive substrate with the isolation region in FIG. 11 according to one embodiment of the present invention.
Figure 13:
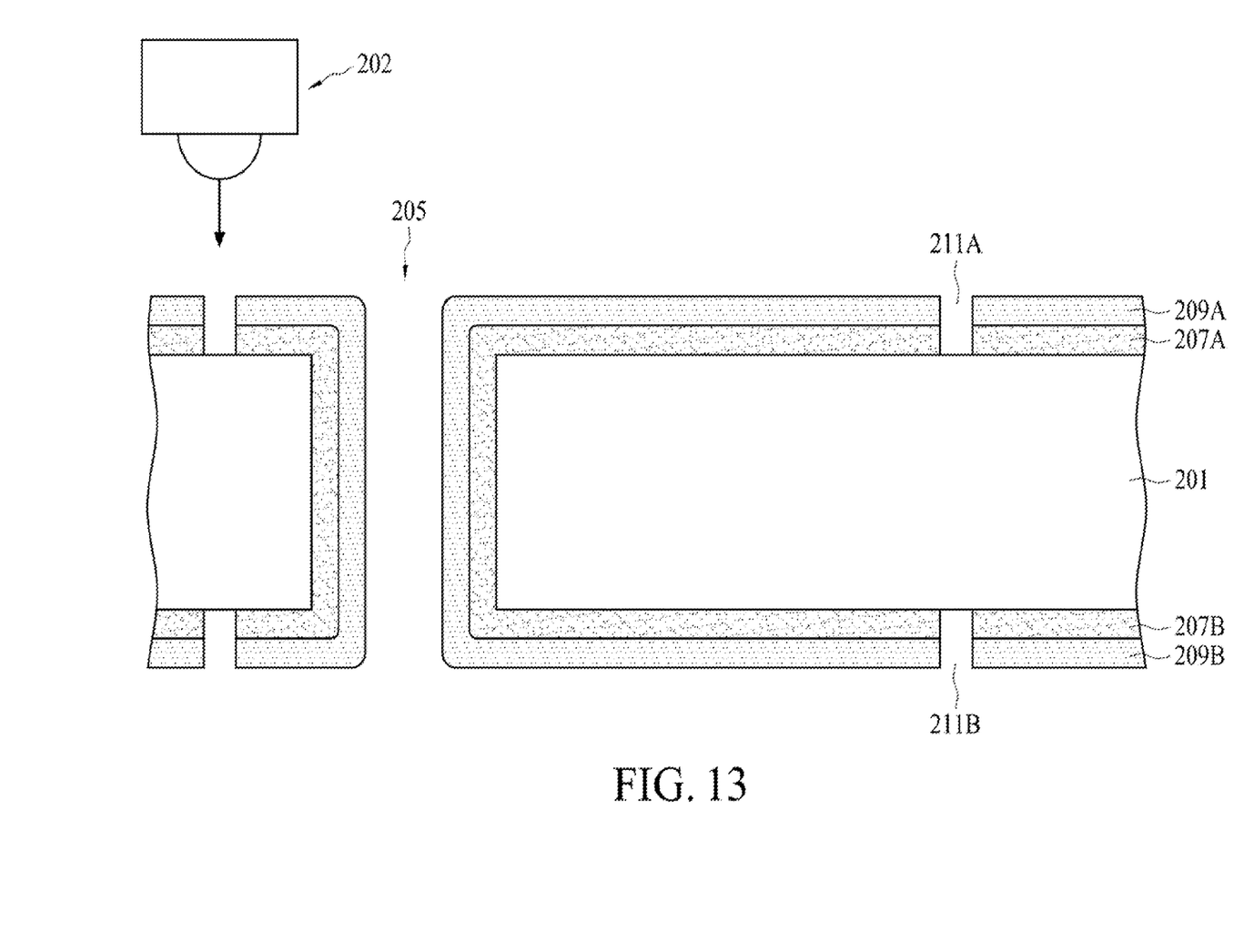
FIG. 13 is a close-up cross-sectional view along a sectional line 4-4 in FIG. 11 according to one embodiment of the present invention.

Referring to FIGS. 11-13, the pulse laser 202 is used again to remove a portion of the top metallic base layer 207A and the first top metal layer 209A from the top surface 201A to create a top isolation region 211A surrounding the top circuit pattern 203A; in addition, the pulse laser 202 also removes a portion of the bottom metallic base layer 207B and the first bottom metal layer 209B from the top surface 201B to create a bottom isolation region 211B surrounding the top circuit pattern 203B.

Consequently, the top metallic base layer 207A and the first top metal layer 209A upon the top circuit pattern 203A are physically separated from a remainder of the top metallic base layer 207A and the first top metal layer 209A outside the top circuit pattern 203A. In other words, the top metallic base layer 207A (the first top metal layer 209A) comprises at least two distinct continuous regions separated from each other so that the two distinct continuous regions are electrically isolated from each other.

Similarly, the bottom metallic base layer 207B and the first bottom metal layer 209B upon the bottom circuit pattern 203B is physically separated from a remainder of the bottom metallic base layer 207B and the first bottom metal layer 209B outside the bottom circuit pattern 203B. In other words, the bottom metallic base layer 207B (the first bottom metal layer 209B) comprises at least two distinct continuous regions separated from each other so that the two distinct continuous regions are electrically isolated from each other.

Figure 14:
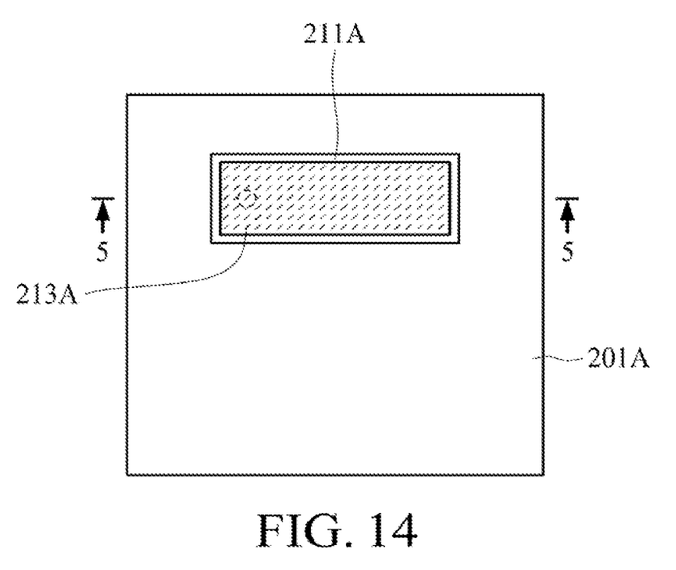
FIG. 14 is a top view of a circuit board with a double-sided conductive circuit according to one embodiment of the present invention.
Figure 15:
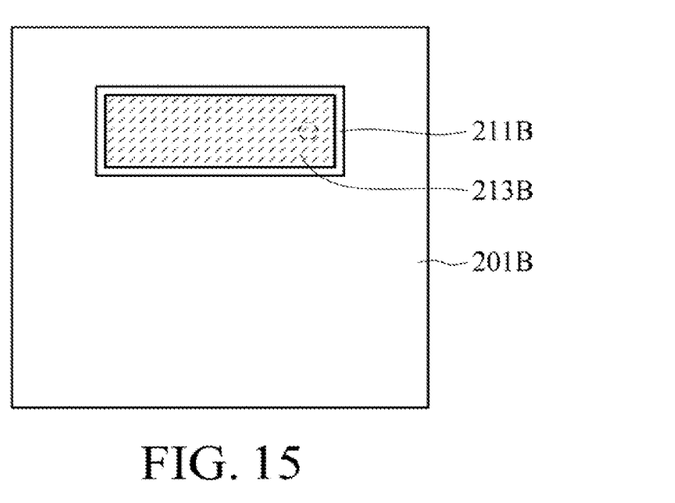
FIG. 15 is a bottom view of the circuit board with the double-sided conductive circuit in FIG. 14 according to one embodiment of the present invention.
Figure 16:
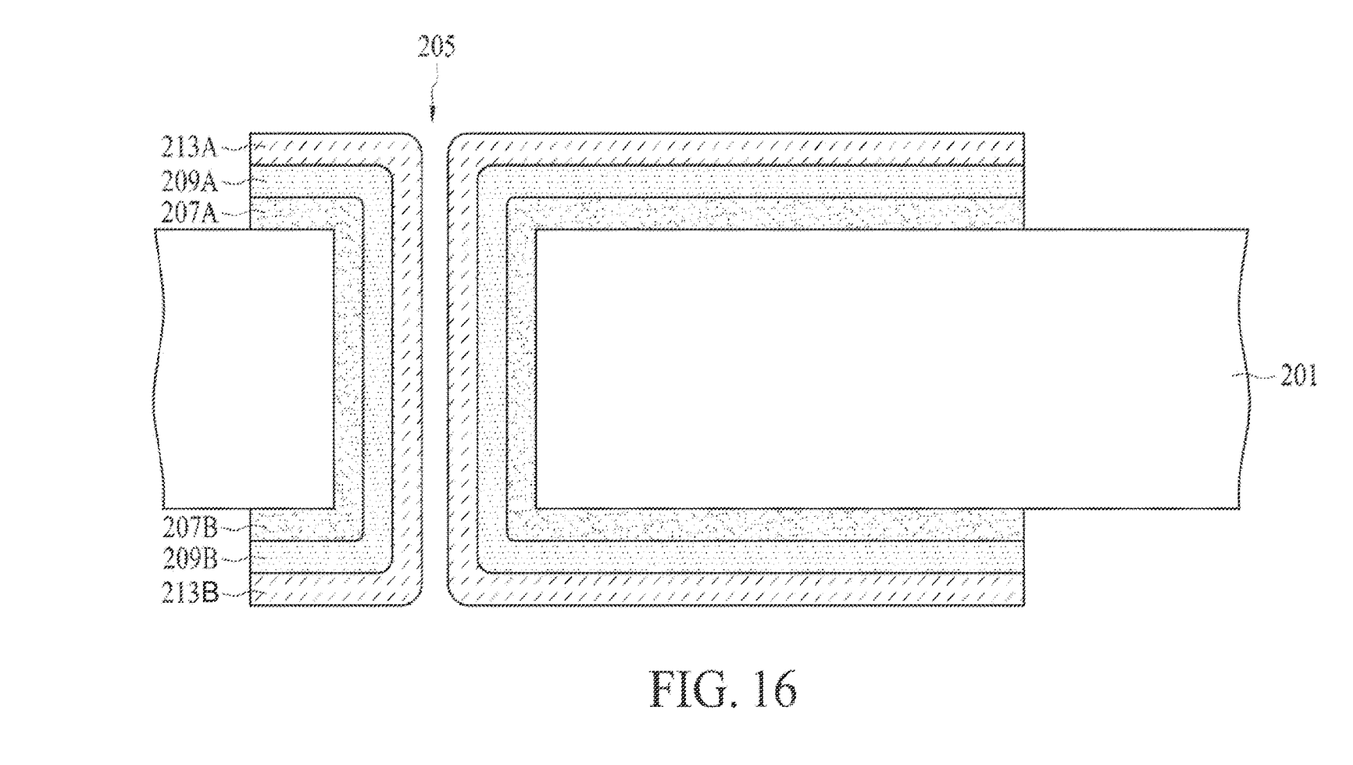
FIG. 16 is a close-up cross-sectional view along a sectional line 5-5 in FIG. 14 according to one embodiment of the present invention.

Referring to FIGS. 14-16, an electroplating process is performed to form a second top metal layer 213A upon the first top metal layer 209A inside the top isolation region 211A, a second bottom metal layer 213B upon the second bottom metal layer 209B inside the bottom isolation region 211B, and the through hole 205 of the non-conductive substrate 201. The electrodes used in the electroplating process can be connected such that the contact is made with the conductor inside the isolation regions 211A and 211B only. Therefore, the second metal layers 213A and 213B can only form upon the first metal layers 209A and 209B contained within the isolation regions 211A and 211B. As a result, a double-sided conductive circuit is formed on the non-conductive substrate 201, and the circuit portion on the top surface is electrically connected to the circuit portion on the bottom surface by a micro via, which is implemented by the conductor in the through hole 205.

Figure 17:
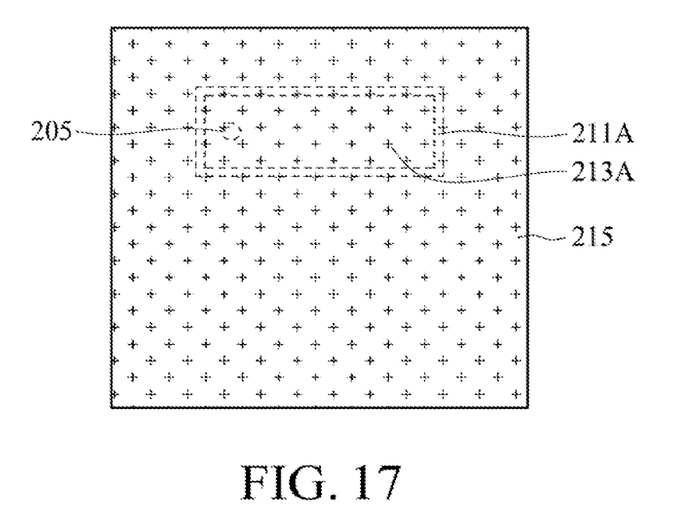
FIG. 17 is a top view of the circuit board with a decoration layer according to one embodiment of the present invention.

Referring to FIG. 17, a decoration process, such as spray painting, can be performed on the top surface 201A to form a decoration layer 215 covering the surface's conductive circuit and the through hole 205. Subsequently, the non-conductive substrate and/or conductive circuit can be further utilized in an electronics fabrication process (i.e., electronic components can be connected to the created continuous conductive circuit and/or the non-conductive substrate can be installed within a device).

The conventional hole processing methods used in fabricating circuit boards are mechanical drilling and injection molding, which cannot make holes of a smaller diameter; therefore, the holes will be easily seen and the circuit board cannot be waterproof. In contrast, the embodiment of the present invention provides a hole processing method, which utilizes a pulse laser to create holes of a smaller size in the non-conductive substrate, and the holes are substantially invisible and waterproof after forming a decoration layer covering the top surface and the holes.

In addition, before performing the conventional injection molding technique to manufacture the holes in the insulation substrate, the positions and sizes of the holes must be confirmed and the mold needs to be manufactured. As a result, the positions and sizes of the holes cannot be easily changed after the mold is manufactured. However, in the embodiment of the present invention, utilizing a pulse laser to create holes of a desired size in the non-conductive substrate can be performed on any desired position of the non-conductive substrate, i.e., the positions and sizes of the holes can be easily changed according to the embodiment of the present invention.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for preparing a circuit board, comprising steps of:
    preparing a non-conductive substrate having a top surface and a bottom surface;
    utilizing a pulse laser to create a top circuit pattern upon the top surface, a bottom circuit pattern upon the bottom surface, and a through hole connecting the top circuit pattern with the bottom circuit pattern; and
    forming a conductive circuit upon the top circuit pattern and the bottom circuit pattern and inside the through hole, wherein the conductive circuit is restricted from being formed upon the top surface outside of the top circuit pattern and the bottom surface outside of the bottom circuit pattern,
    wherein the forming of the conductive circuit comprises steps of:
        forming a metallic base layer upon the top surface and the bottom surface and inside the through hole, wherein the top metallic base layer at least covers the top circuit pattern and the bottom metallic base layer at least covers the bottom circuit pattern;
        forming a first metal layer at least upon the metallic base layer; and
        creating a top isolation region surrounding the top circuit pattern and a bottom isolation region surrounding the bottom circuit pattern,
    wherein the creating of the top isolation region and the bottom isolation region utilizes a pulse laser,
    wherein the method further comprises a step of forming a second metal layer upon the first metal layer inside the top isolation region, the bottom isolation region, and the through hole, the second metal layer is restricted from being formed upon the first metal layer outside of the top isolation region and the bottom isolation region, and
    wherein the second metal layer is formed using an electroplating process upon the first metal layer inside the top isolation region, the bottom isolation region, and the through hole of the non-conductive substrate.

2. The method for preparing a circuit board of claim 1, further comprising a step of forming a decoration layer covering the top surface.

3. A method for preparing a circuit board, comprising steps of:
    preparing a non-conductive substrate having a top surface and a bottom surface;
    utilizing a pulse laser to create a top circuit pattern upon the top surface, a bottom circuit pattern upon the bottom surface, and a through hole connecting the top circuit pattern with the bottom circuit pattern;

submerging the non-conductive substrate in an active metal solution for a predefined amount of time, wherein the active metal solution contains metallic particles;

removing the non-conductive substrate from the active metal solution when the predetermined amount of time has elapsed, wherein the removed non-conductive substrate comprises a metallic base layer formed from the metallic particles;

performing an electroless plating process to form a first metal layer at least upon the metallic base layer;

utilizing the pulse laser to remove a portion of the metallic base layer from the non-conductive substrate to form at least one isolation region, wherein the metallic base layer comprises at least two distinct continuous regions separated from each other so that the two distinct continuous regions are electrically isolated from each other; and electroplating the non-conductive substrate having the at least one isolation region by attaching electrodes to only the first metal layer of one of the at least two distinct continuous regions to form a second metal layer upon the first metal layer for that continuous region, wherein at least one of the at least two distinct continuous regions lacks the second metal layer after the electroplating.

4. The method for preparing a circuit board of claim 3, further comprising a step of forming a decoration layer covering the top surface.

* * * * *